United States Patent
Wang et al.

(10) Patent No.: US 8,769,459 B2
(45) Date of Patent: Jul. 1, 2014

(54) HIGH-END FAULT-TOLERANT COMPUTER SYSTEM AND METHOD FOR SAME

(75) Inventors: Edong Wang, Beijing (CN); Leijun Hu, Beijing (CN); Rengang Li, Beijing (CN)

(73) Assignee: Inspur (Beijing) Electronic Information Industry Co., Ltd., Beijing (CN)

( * ) Notice: Subject to any disclaimer, the term of this patent is extended or adjusted under 35 U.S.C. 154(b) by 0 days.

(21) Appl. No.: 14/002,827

(22) PCT Filed: Mar. 6, 2012

(86) PCT No.: PCT/CN2012/071956
§ 371 (c)(1),
(2), (4) Date: Sep. 3, 2013

(87) PCT Pub. No.: WO2012/119533
PCT Pub. Date: Sep. 13, 2012

(65) Prior Publication Data
US 2013/0346934 A1    Dec. 26, 2013

(30) Foreign Application Priority Data
Mar. 7, 2011   (CN) .......................... 2011 1 0053727

(51) Int. Cl.
*G06F 17/50*    (2006.01)

(52) U.S. Cl.
USPC ....................................... 716/110

(58) Field of Classification Search
USPC ................................ 716/100, 110
See application file for complete search history.

(56) References Cited

U.S. PATENT DOCUMENTS

| | | | | |
|---|---|---|---|---|
| 4,968,977 A | * | 11/1990 | Chinnaswamy et al. | 340/2.24 |
| 7,185,138 B1 | * | 2/2007 | Galicki | 710/316 |
| 7,191,380 B2 | * | 3/2007 | Kuekes et al. | 714/758 |
| 7,310,004 B2 | * | 12/2007 | DeHon | 326/41 |
| 7,495,942 B2 | * | 2/2009 | Davis et al. | 365/49.1 |
| 8,159,973 B2 | | 4/2012 | Deng et al. | |

(Continued)

FOREIGN PATENT DOCUMENTS

| | | |
|---|---|---|
| CN | 1742259 A | 3/2006 |
| CN | 101216815 A | 7/2008 |

(Continued)

OTHER PUBLICATIONS

International Search Report (in Chinese with English translation) for PCT/CN2012/071956, mailed May 31, 2012; ISA/CN.

*Primary Examiner* — Suchin Parihar
(74) *Attorney, Agent, or Firm* — Harness, Dickey & Pierce, PLC

(57) ABSTRACT

The present invention provides a high-end fault-tolerant computer system and an implementation method. The system includes N single junction prototype verification systems and M crossbar-switch interconnection router chipsets. Each crossbar-switch interconnection router chipset is used to achieve the interconnection among the N single junction prototype verification systems. Switching is not performed among all crossbar-switch interconnection router chipsets, and both M and N are positive integers greater than or equal to 2. The single junction includes: a computer board, which is 4-path tightly-coupled computer board, and a junction controller for controlling 2 paths of CPUs on the computer board. The present invention can effectively realize the global memories sharing, balance the system transmission bandwidth and delay, and solve the problem of the integration reliability of multi-path CPU system.

12 Claims, 2 Drawing Sheets

(56) References Cited

U.S. PATENT DOCUMENTS

| | | | |
|---|---|---|---|
| 8,510,239 B2 * | 8/2013 | Modha | 706/14 |
| 2004/0064620 A1 | 4/2004 | Kaushik et al. | |
| 2009/0024829 A1 | 1/2009 | Deng et al. | |
| 2009/0094436 A1 | 4/2009 | Deng et al. | |
| 2011/0010468 A1 | 1/2011 | Hu et al. | |

FOREIGN PATENT DOCUMENTS

| | | |
|---|---|---|
| CN | 101330413 A | 12/2008 |
| CN | 10135469 A | 1/2009 |
| CN | 102122259 A | 7/2011 |
| CN | 102129418 A | 7/2011 |
| CN | 102142050 A | 8/2011 |

* cited by examiner

HIGH-END FAULT-TOLERANT COMPUTER SYSTEM AND METHOD FOR SAME

CROSS-REFERENCE TO RELATED APPLICATIONS

This application is a 371 U.S. National Stage of International Application No. PCT/CN2012/071956, filed Mar. 6, 2012, and claims priority to Chinese Patent Application No. 201110053727.2, filed Mar. 7, 2011, the disclosures of which are herein incorporated by reference in their entirety.

TECHNICAL FIELD

The present invention relates to the field of high-end computer design, and in particular, to a high-end fault-tolerant computer system and an implementation method.

BACKGROUND OF THE RELATED ART

With the development at full speed of the computer technology, in order to meet the requirement of the economic society development, high reliability computer system becomes one of the bottlenecks restricting the key field of the social development. The critical fields, such as finance, telecommunication, etc., have extremely high requirements on the reliability of the computer system. Therefore, the bulky multi-path computer system with high reliability needs to be constructed, so as to meet the application demand in the current various fields; but on the other hand it also fell into the technical problem of the system reliability brought by the multi-path computer system interconnection, that is, the number of processors of the computer system is increasing constantly, and then the increasingly high integration density makes the system reliability design difficulty increase.

SUMMARY OF THE INVENTION

The technical problem that the present invention requires to solve is to provide a high-end fault-tolerant computer system and an implementation method, which can realize the global memories sharing effectively, balance the system transmission bandwidth and delay and solve the problem of the integration reliability of the multi-path CPU system effectively, and have very high technical values.

In order to solve the above-mentioned technical problem, the present invention provides a high-end fault-tolerant computer system, comprising N single junction prototype verification systems and M crossbar-switch interconnection router chipsets, wherein, each crossbar-switch interconnection router chipset is used to achieve interconnection among the N single junction prototype verification systems, switching is not performed among all crossbar-switch interconnection router chipsets, and both M and N are positive integers greater than or equal to 2, wherein, the single junction prototype verification system comprises:

a computer board, which is a four-path tightly-coupled computer board, a chip verification board, comprising two junction controller chipsets; wherein, each junction controller chipset comprises: two field-programmable gate array (FGPA) chips which bear a logic of one junction controller together; and an interconnection board, comprising two FGPA chips; wherein, each FPGA chip provides a high speed interconnection port configured to achieve protocol interconnection between two paths of the computer board and one of the junction controller chipsets.

Preferably, the above-mentioned system further has the following characteristics:

the four-path tightly-coupled computer board comprises 4 CPUs, wherein, the 4 CPUs are interconnected internally, and share memories with each other; and all CPUs in the N single junction prototype verification systems are interconnected through the junction controller chipsets and the crossbar-switch interconnection router chipsets, and share memories with each other.

Preferably, the above-mentioned system further has the following characteristics:

The logic of the junction controller comprises: cache consistency control and internet interface control.

Preferably, the above-mentioned system further has the following characteristics:

the chip verification board has a network interface (NI); and the plurality of the single junction prototype verification systems are connected with the crossbar-switch interconnection router chipsets through the NI interfaces on their own chip verification boards.

Preferably, the above-mentioned system further has the following characteristics:

a value of N is 8; and a value of M is 4.

In order to solve the above-mentioned technical problem, the present invention further provides an implementation method for a high-end fault-tolerant computer system, comprising:

selecting a computer board, wherein, the computer board is a four-path tightly-coupled computer board;

selecting a chip verification board which comprises two junction controller chipsets; wherein, each junction controller chipset comprises: two field-programmable gate array (FGPA) chips which bear a logic of one junction controller together;

selecting an interconnection board which comprises two FGPA chips; wherein, each FPGA chip provides a high speed interconnection port used to achieve protocol interconnection between two paths of the computer board and one of the junction controller chipsets;

connecting 2 paths of the computer boards to one junction controller chipset in the computer board through one FPGA chip in the interconnection board, and connecting other 2 paths of the computer boards to another junction controller chipset in the computer board through another FPGA chip in the interconnection board, thus forming a single junction prototype verification system;

connecting each single junction prototype verification system in the N single junction prototype verification systems with each crossbar-switch interconnection Router chipset in the M crossbar-switch interconnection router chipsets respectively, wherein, switching is not performed among all crossbar-switch interconnection router chipsets, and any one of the crossbar-switch interconnection router chipsets achieves internal interconnection with the N single junction prototype verification systems connected therewith, so as to form a N-junction and 4*N-path system; M and N are positive integers greater than or equal to 2.

Preferably, the above-mentioned method further has the following characteristics:

the four-path tightly-coupled computer board comprises 4 CPUs, wherein, the 4 CPUs are interconnected internally, and share memories with each other; and all CPUs in the N single junction prototype verification systems are interconnected through the junction controller chipsets and the crossbar-switch interconnection router chipsets, and share memories with each other.

Preferably, the above-mentioned system further has the following characteristics:

A logic of the junction controller comprises: cache consistency control and internet interface control.

Preferably, the above-mentioned system further has the following characteristics:

the chip verification board has a network interface (NI); and when interconnecting the N single junction prototype verification systems, the N single junction prototype verification systems are connected with the crossbar-switch interconnection router chipsets through the NI interfaces on their own chip verification board.

Preferably, the above-mentioned system further has the following characteristics:

a value of N is 8; and a value of M is 4.

A high-end fault-tolerant computer system comprises:

N single junctions and M crossbar-switch interconnection router chipsets (NR), wherein, each crossbar-switch interconnection router chipset is used to achieve internal interconnection among the N single junctions, switching is not performed among all crossbar-switch interconnection router chipsets, and both M and N are positive integers greater than or equal to 2, wherein, the single junction comprises:

a computer board, which is a four-path tightly-coupled computer board; and a junction controller, for controlling 2 paths of CPUs on the computer board.

Preferably, the four-path tightly-coupled computer board comprises 4 CPUs, wherein, the 4 CPUs are interconnected internally, and share memories with each other; and Preferably, all CPUs in the N single junctions are interconnected through the junction controller and the crossbar-switch interconnection router chipsets, and share memories with each other.

Preferably, a value of N is 8; and a value of M is 4.

An implementation method for a high-end fault-tolerant computer system according to the above description comprises:

selecting a computer board which is a four-path tightly-coupled computer board;

selecting a junction controller, for controlling 2 paths of CPUs on the computer board to form a single junction interconnection;

interconnecting the plurality of the single junctions by using the interconnection router chipsets, wherein, there are N single junctions and M crossbar-switch interconnection router chipsets (NR), each crossbar-switch interconnection router chipset is used to achieve internal interconnection among the N single junctions, switching is not performed among all crossbar-switch interconnection router chipsets, and both M and N are positive integers greater than or equal to 2.

Preferably, a value of N is 8; and a value of M is 4.

The high-end fault-tolerant computer system and the implementation method provided by the embodiment of the present invention can realize the global memory sharing effectively, balance the system transmission bandwidth and delay, and solve the problem of the integration reliability of the multi-path CPU system effectively, which have very high technical values.

PREFERRED EMBODIMENTS OF THE PRESENT INVENTION

The embodiment of the present invention is described in detail with reference to the accompanying drawings hereinafter.

Figure 1:
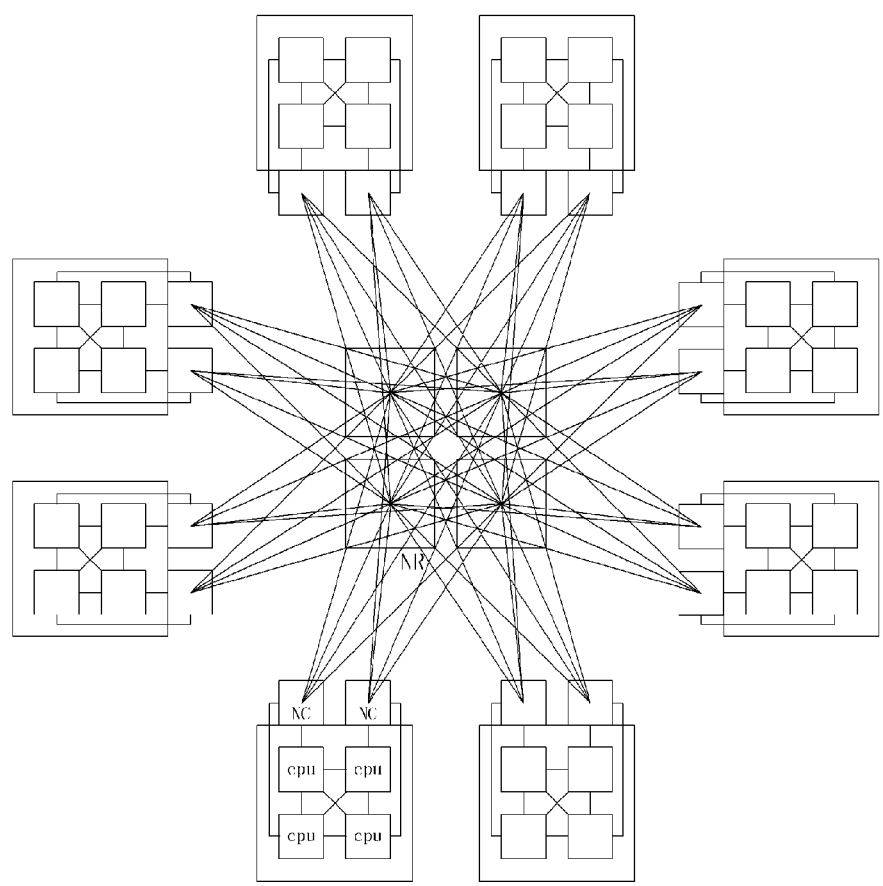
FIG. 1 is a block diagram of a high-end fault-tolerant computer system according to an embodiment of the present invention.

Referring to FIG. 1, the figure shows a diagram of a high-end fault-tolerant computer system according to an embodiment of the present invention, including N single junction prototype verification systems and M crossbar-switch interconnection router chipsets (NR), wherein, each crossbar-switch interconnection router chipset is used to achieve internal interconnection among the N single junction prototype verification systems to form a N-junction 4*N-path system, switching is not performed among all crossbar-switch interconnection router chipsets, thus guaranteeing that M sets of parallel networks constituted by the M crossbar-switch interconnection router chipsets are independent with each other, and both M and N are positive integers greater than or equal to 2, wherein, the single junction prototype verification system includes:

a computer board, which is a four-path tightly-coupled computer board, a chip verification board, including two junction controller chipsets; wherein, each junction controller chipset includes: two field-programmable gate array (FGPA) chips which bear logic of one junction controller together; and an interconnection board, including two FGPA chips; wherein, each FPGA chip provides a high speed interconnection port configured to achieve protocol interconnection between two paths of the computer board and one of the junction controller chipsets.

Wherein, in FIG. 1, the interconnection board and the chip verification board form 2 junction controllers (NC), and each junction controller includes a junction controller chipset on the chip verification board and a field-programmable gate array (FPGA) chip on the interconnection board, to control the 2 paths of CPUs on the computer board.

Wherein, the four-path tightly-coupled computer board includes 4 CPUs, and the 4 CPUs are interconnected internally, and share memories with each other; and all CPUs in the N single junction prototype verification systems are interconnected through the junction controller chipsets and the crossbar-switch interconnection router chipsets, and share memories with each other, that is, 4*N CPUs inside the whole N-junction 4*N-path system share the memories with each other.

Wherein, the logic of the junction controller includes: cache consistency control and internet interface control.

Wherein, the 2 FPGA chips of the interconnection board further can provide various debugging means and testing methods for the verification work besides realizing the logic of the physical layer and guaranteeing the interconnection link handshaking initialization and the signal transmission quality.

Wherein, the crossbar-switch interconnection router chipset can, through a high speed interface, such as a PCIe interface, a Network Interface (NI) Interface, an optical interface, an AMD HT interface, an Intel QPI interface, and other protocol interfaces developed independently, realize the internal interconnection of the plurality of the single junction prototype verification systems, realize the multi-CPU system integration, and realize the global memory sharing effectively, which solves the problem of the verification complexity of ultra large scale integrated circuit design in the multi-CPU system effectively, realizes the requirement on the system performance of the high-end computer on the basis of guaranteeing the system verification of the computer and the key chipset verification of the high-end server, and has a very high technical value. The board-level multistage interconnection provides a large number of debugging interfaces and verification means for the debugging and verification at the same time, reduces the difficulty and complexity of the verification greatly, saves the development cost of the project, and shortens the project development cycle.

The present invention adopts the multi-cell board interconnection mode to realize the large scale junction controller chipset FPGA verification ingeniously, and works out the single junction prototype verification system described in the above-mentioned embodiment finally through further study and trial and error, and it is a four-path single junction system, wherein:

when the minimum calculation unit of the system is selected, from the point of view of realizing the optimization, it is fully considered that more than four paths will increase the computer board scale while against platemaking and less than four paths will increase the computer board quantity while against the whole system integration, therefore, the four-path tightly-coupled computer board is selected as the minimum calculation unit of the system after overall consideration.

The independent design logic verification unit, that is, the junction controller chipset, realizes the system Cache consistency control and the internet interface control: realizing the logic of one junction controller chipset through adopting two slices of high-capacity high-end FPGA chips, thus effectively guaranteeing the FPGA verification coverage of the junction controller chipset, guaranteeing to perform the overall verification on the junction controller logic, and laying a foundation for realizing the chip Application-Specific Integrated Circuit (ASIC). Wherein, on the basis of the design specification and interface of the selected computational element (that is, the four-path tightly-coupled computer board), two junction controller chipsets are required to be configured for the computing element, which are responsible for the interconnection of the two-path CPUs respectively.

On the basis of the design specification and interface of the selected computing element (that is, the four-path tightly-coupled computer board), four-port interconnection single board is selected to complete the four-port protocol interconnection of the computing element and the logic verification element; two high speed interconnection ports are provided by two high-end FPGA chips respectively to guarantee the high speed interconnection protocol of the overall system and provide abundant debugging interface and verification means for the logic verification.

The above-mentioned single junction prototype verification system also has very good expansibility, and is able to cascade the plurality of the above-mentioned single junction prototype verification systems conveniently, thus realizing the multi-CPU system integration, realizing the global memory sharing effectively, solving the problem of the verification complexity of ultra large scale integrated circuit design in the multi-CPU system effectively, and having a very high technical value.

Further, in order to improve the system performance, reduce the design difficulty and the design complexity, and improve the reusability characteristic of the design, in the present invention, aiming at the structural features of the high integration density of the multi-path computer system and on the basis of the above-mentioned single junction prototype verification system, it is to adopt the system interconnection router chipsets to realize the internal interconnection of the N isomorphic single junction prototype verification systems to form a N-junction 4*N-path system, thus realizing the design requirement of the tightly-coupled shared memory. Meanwhile, the symmetrical isomorphic structures of the N single junction prototype verification systems realize the same step length of the exchange visiting among the system processors, and guarantee the performance of the tightly-coupled shared memories system; and the symmetrical isomorphic structures also reduce the design complexity of the multi-path system greatly and improve the reusability of the design, and saves a large amount of project development time for the design verification and board debugging, and shortens the project development cycle.

Further, the present invention fully considers the characteristic of the multi-path processor system integration and the design requirement of the high reliability system, on the basis of the above-mentioned N-junction 4*N-path system, the M crossbar-switch interconnection router chipsets are used to parallelly and isomorphically expand M isomorphic N-junction 4*N-path system; because switching is not performed among all stated crossbar-switch interconnection router chipsets, thus guaranteeing that the M N-junction 4*N-path systems constituted by the M crossbar-switch interconnection router chipsets are independent with each other, and such a fault-tolerant mechanism has improved the reliability of the high-end computer system greatly, and has improved the fault-tolerant mechanism in its special field applications.

Preferably, fully considering the system efficiency, the design complexity and the cost, from the point of view of realizing the optimization, after the trial and error and comparison, aiming at the characteristic of the 32-path high-end system, the present invention further provides the most reasonable 32-path high-end fault-tolerant computer system, that is, 8 single junction prototype verification systems are selected to form a 8-junction 32-path prototype verification system by adopting the above-mentioned way, and 4 crossbar-switch interconnection router chipsets are used to parallelly and isomorphically expand 4 8-junction 32-path systems, as shown in FIG. 1. This is put forward according to the request of the system reliability, after the trial and error and comparison, when it is found that the number of the 8-junction 32-path prototype verification systems expanded parallelly and isomorphically is less than 4 sets, the system reliability is lower; the reliability will be higher when it is greater than 4 sets, but the system scale is too large, which brings the difficulty to the frameworks design, such as the chassis, heat dissipation, etc., so selecting 4 sets is the best choice after overall consideration. In FIG. 1, it includes 4 sets of parallel isomorphic 8-junction 32-path systems; combining with the system self-adaptation route mechanism, it is guaranteed that the system still can use only one un-fault network to perform the communication when 3 sets of network break down, thus improving the reliability of the high-end computer system greatly and improving the fault-tolerant mechanism in its special field applications; as to a 8-junction 32-path system, it is expanded and realized based on the single junction 4-path prototype verification system by analyzing the structural features of the interconnection chipset, the protocol processing capacity and the processing mechanism; 16 junction controller chipsets in the whole 32-path system realize the Cache consistency control and the internet interface control of the overall system.

Figure 2:
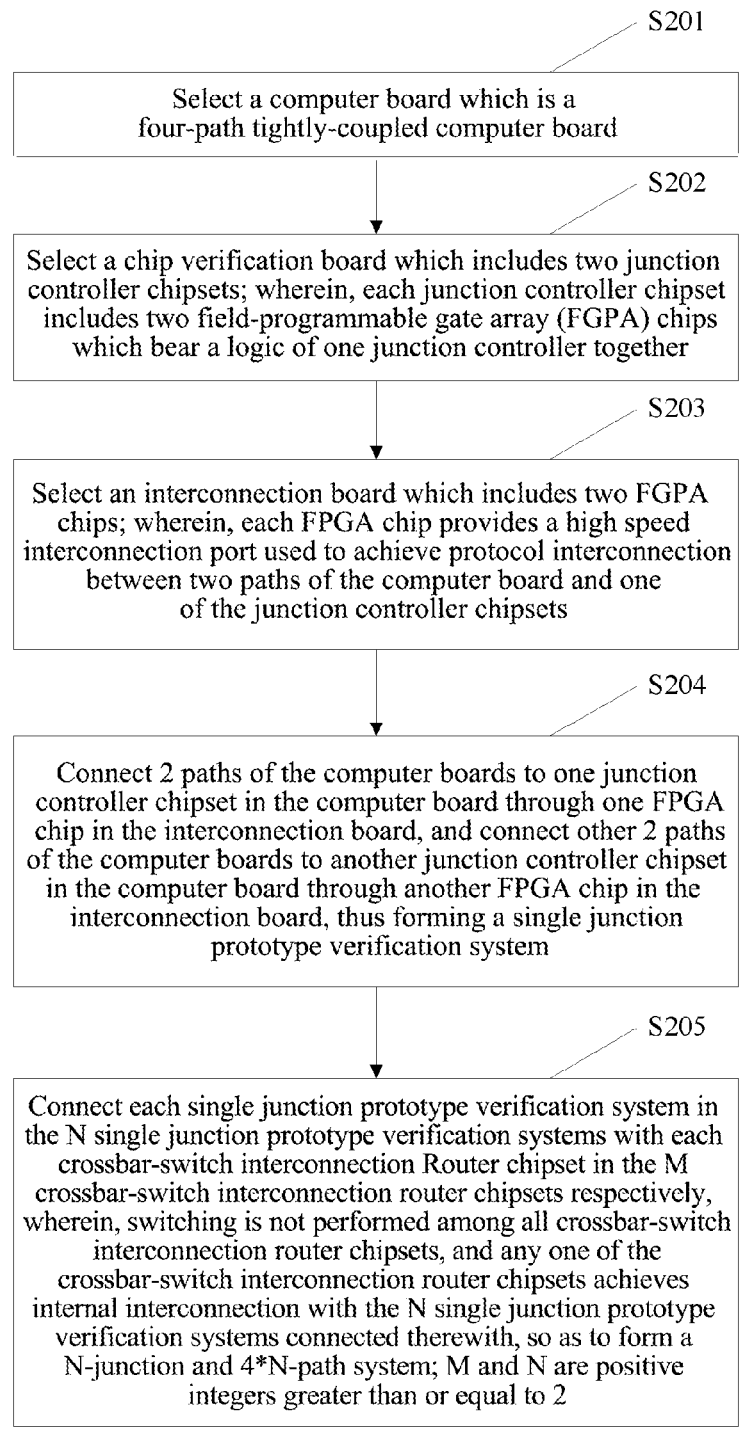
FIG. 2 is a flow chart of an implementation method for a high-end fault-tolerant computer system according to an embodiment of the present invention.

The embodiment of the present invention further provides an implementation method for a high-end fault-tolerant computer system, as shown in FIG. 2, including the following steps:

in step S201, a computer board is selected, wherein, the computer board is a four-path tightly-coupled computer board;

the four-path tightly-coupled computer board includes 4 CPUs, wherein, the 4 CPUs are interconnected internally, and share memories with each other;

in step S202, a chip verification board is selected, which includes two junction controller chipsets; wherein, each junction controller chipset includes: two field-programmable gate array (FGPA) chips which bear the logic of one junction controller together;

the logic of the junction controller includes: cache consistency control and internet interface control;

in step S203, an interconnection board is selected, which includes two FGPA chips; wherein, each FPGA chip provides a high speed interconnection port used to achieve protocol interconnection between two paths of the computer board and one of the junction controller chipsets;

in step S204, 2 paths of the computer boards are connected to one junction controller chipset in the computer board through one FPGA chip in the interconnection board, and other 2 paths of the computer boards are connected to another junction controller chipset in the computer board through another FPGA chip in the interconnection board, thus forming a single junction prototype verification system;

in step S205, each single junction prototype verification system in the N single junction prototype verification systems is connected with each crossbar-switch interconnection Router chipset in the M crossbar-switch interconnection router chipsets respectively, wherein, switching is not performed among all crossbar-switch interconnection router chipsets, and any one of the crossbar-switch interconnection router chipsets achieves internal interconnection with the N single junction prototype verification systems connected therewith, so as to form a N-junction and 4*N-path system; M and N are positive integers greater than or equal to 2.

In the formed N-junction 4*N-path system, all CPUs in the N single junction prototype verification systems are interconnected through the junction controller chipsets and the crossbar-switch interconnection router chipsets, share the memories with each other, that is, the 4*N CPUs inside the whole N-junction 4*N-path system share the memories with each other.

Wherein, when step S205 is executed, the crossbar-switch interconnection router chipsets can, through a high speed interface, such as a PCIe interface, a Network Interface (NI) Interface, an optical interface, an AMD HT interface, an Intel QPI interface, and other protocol interfaces developed independently, realize the internal interconnection of the plurality of the single junction prototype verification systems, realize the multi-CPU system integration, and realize the global memory sharing effectively.

Wherein, aiming at the characteristic of the 32-path high-end system, when step S205 is executed, 8 single junction prototype verification systems can be selected to form the 8-junction 32-path prototype verification system, and 4 crossbar-switch interconnection router chipsets are used to parallelly and isomorphically expand 4 8-junction 32-path systems, and provides the reliability and fault tolerance of the 32-path system in the most reasonable way.

In another embodiment, it still adopts a structure similar to the one shown in FIG. 1, the parallel network structure design of the high-end fault-tolerant computer system mainly includes: a single set of 32-path system structure design (1), and 4 sets of the parallel network structure and fault-tolerant structure design (2).

According to the structural features of the high integration density of the multi-path computer system, in order to realize the system fault-tolerant mechanism and improve the system reliability and the design reusability, the 4-path computer board is adopted as the system minimum computation module, the 32-path system adopts 8 sets of isomorphic computation elements, and the internal interconnection of the processor is realized in the computer board to achieve the design requirement of the tightly-coupled shared memory. According to the characteristic of the configuration structure of the processor (that is, CPU), the structure that the single computer board is configured with two junction controller chipsets is adopted, and every two processors connect to one junction controller to realize the interconnection control of the whole system and its Cache consistency control; 32-path system, that is, 16 junction controller chipsets totally, controls the interconnection with the crossbar-switch interconnection router chipsets interconnected with the system through their own internet interface respectively, thus realizing the 32-path tightly-coupled shared memory high-end fault-tolerant computer system.

Specifically, the high-end fault-tolerant computer system includes:

N single junctions and M crossbar-switch interconnection router chipsets (NR), wherein, each crossbar-switch interconnection router chipset is used to achieve internal interconnection among the N single junctions to form a N-junction 4*N-path system, switching is not performed among all crossbar-switch interconnection router chipsets, thus guaranteeing that M sets of parallel networks constituted by the M crossbar-switch interconnection router chipsets are independent with each other, and both M and N are positive integers greater than or equal to 2, wherein, the single junction includes:

a computer board, which is a four-path tightly-coupled computer board; and a junction controller, for controlling 2 paths of CPUs on the computer board.

Wherein, the four-path tightly-coupled computer board includes 4 CPUs, and the 4 CPUs are interconnected internally, and share memories with each other; and all CPUs in the N single junctions are interconnected through the junction controller and the crossbar-switch interconnection router chipsets, and share memories with each other; that is, the 4*N CPUs in the whole N-junction 4*N-path system share the memories with each other.

Accordingly, the implementation method for a high-end fault-tolerant computer system includes:

selecting a computer board, wherein, the computer board is a four-path tightly-coupled computer board; wherein, the four-path tightly-coupled computer board includes 4 CPUs, and the 4 CPUs are interconnected internally and share memories with each other;

selecting a junction controller, for controlling 2 paths of CPUs on the computer board;

interconnecting the plurality of the single junctions by using the interconnection router chipsets, wherein there are N single junctions and M crossbar-switch interconnection router chipsets (NR), each crossbar-switch interconnection router chipset is used to achieve internal interconnection among the N single junctions, switching is not performed among all crossbar-switch interconnection router chipsets, and both M and N are positive integers greater than or equal to 2.

In the formed N-junction 4*N-path system, all CPUs in the N single junctions are interconnected through the crossbar-switch interconnection router chipsets, and share memories with each other; that is, the 4*N CPUs in the whole N-junction 4*N-path system share the memories with each other.

The value of N is 8; and the value of M is 4.

The beneficial results of the above-mentioned embodiment are that: the structure design characteristic of the single set of 32-path system mainly refers to designing the whole computer system based on the 4-path computer board system according to the system scale and the performance analysis in the system structure design phase, realizing the processor interconnection within the computer board, and meeting the requirement of its shared memory design; the 2 paths of processors realizes processing and control of the remote processor accessing the messages through one junction controller; the whole 32-path system adopts 16 junction controllers to realize the Cache consistency control and the internet interface control of the whole system; 16 junction controller chipsets in the system are connected to the crossbar-switch interconnection router chipsets through an internet port respectively, and the interconnection of the whole system is realized by the crossbar-switch interconnection router chipsets; the characteristic of 4-set parallel network structure and fault-tolerant structure design mainly refers to adopting 4 crossbar-switch interconnection router chipsets to parallelly expand to 4 sets of network structures based on the single set 32-path system structure design; switching is not performed among the 4 crossbar-switch interconnection router chipsets, which guarantees that the system still can use the only one un-fault network to perform the communication when 3 sets of networks break down, and improves the reliability and the fault-tolerant mechanism of the system greatly. The system structure design of the computer system realizes the system integration of the multi-path CPU, realizes the global memory sharing effectively, balances the system transmission bandwidth and delay, and solves the problem of the integration reliability of the multi-path CPU system effectively.

Certainly, the present invention can have a variety of other embodiments. Those skilled in the art can make the corresponding modifications and variations according to the present invention without departing from the spirit and essence of the present invention. And all of these modifications or the variations should be embodied in the scope of the appended claims of the present invention.

Industrial Applicability

The high-end fault-tolerant computer system and the implementation method provided by the embodiment of the present invention can realize the global memory sharing effectively, balance the system transmission bandwidth and delay, and solve the problem of the integration reliability of the multi-path CPU system effectively, which have very high technical values.

What we claim is:

1. A high-end fault-tolerant computer system, comprising N single junction prototype verification systems and M crossbar-switch interconnection router chipsets, wherein, each crossbar-switch interconnection router chipset is used to achieve interconnection among the N single junction prototype verification systems, switching is not performed among all crossbar-switch interconnection router chipsets, and both M and N are positive integers greater than or equal to 2, wherein, the single junction prototype verification system comprises:
a computer board, which is a four-path tightly-coupled computer board,
a chip verification board, comprising two junction controller chipsets; wherein, each junction controller chipset comprises: two field-programmable gate array (FGPA) chips which bear a logic of one junction controller together; and
an interconnection board, comprising two FGPA chips; wherein, each FPGA chip provides a high speed interconnection port configured to achieve protocol interconnection between two paths of the computer board and one of the junction controller chipsets;
wherein the four-path tightly-coupled computer board comprises 4 CPUs, the 4 CPUs are interconnected internally, and share memories with each other; and
all CPUs in the N single junction prototype verification systems are interconnected through the junction controller chipsets and the crossbar-switch interconnection router chipsets, and share memories with each other.

2. The system according to claim 1, wherein,
a logic of the junction controller comprises: cache consistency control and internet interface control.

3. The system according to claim 1, wherein,
the chip verification board has a network interface (NI); and
the plurality of the single junction prototype verification systems are connected with the crossbar-switch interconnection router chipsets through the NI interfaces on the chip verification boards thereof respectively.

4. The system according to claim 1, wherein,
a value of N is 8; and
a value of M is 4.

5. An implementation method for a high-end fault-tolerant computer system, comprising:
selecting a computer board which is a four-path tightly-coupled computer board; selecting a chip verification board which comprises two junction controller chipsets; wherein, each junction controller chipset comprises: two field-programmable gate array (FGPA) chips which bear logic of one junction controller together;
selecting an interconnection board which comprises two FGPA chips; wherein, each FPGA chip provides a high speed interconnection port used to achieve protocol interconnection between two paths of the computer board and one of the junction controller chipsets;
connecting 2 paths of the computer boards to one junction controller chipset in the computer board through one FPGA chip in the interconnection board, and connecting other 2 paths of the computer boards to another junction controller chipset in the computer board through another FPGA chip in the interconnection board, thus forming a single junction prototype verification system;
connecting each single junction prototype verification system in the N single junction prototype verification systems with each crossbar-switch interconnection Router chipset in the M crossbar-switch interconnection router chipsets respectively, wherein, switching is not performed among all crossbar-switch interconnection router chipsets, and any one of the crossbar-switch interconnection router chipsets achieves internal interconnection with the N single junction prototype verification systems connected therewith, so as to form a N-junction and 4*N-path system; M and N are positive integers greater than or equal to 2;

wherein the four-path tightly-coupled computer board comprises 4 CPUs, the 4 CPUs are interconnected internally, and share memories with each other; and all CPUs in the N single junction prototype verification systems are interconnected through the junction controller chipsets and the crossbar-switch interconnection router chipsets, and share memories with each other.

6. The method according to claim 5, wherein, a logic of the junction controller comprises: cache consistency control and internet interface control.

7. The method according to claim 5, wherein, the chip verification board has a network interface (NI); and when interconnecting the N single junction prototype verification systems, the N single junction prototype verification systems are connected with the crossbar-switch interconnection router chipsets through the NI interfaces on the chip verification boards thereof respectively.

8. The method according to claim 5, wherein, a value of N is 8; and a value of M is 4.

9. A high-end fault-tolerant computer system, comprising:

N single junctions and M crossbar-switch interconnection router chipsets (NR), wherein, each crossbar-switch interconnection router chipset is used to achieve internal interconnection among the N single junctions, switching is not performed among all crossbar-switch interconnection router chipsets, and both M and N are positive integers greater than or equal to 2, wherein, the single junction comprises:

a computer board, which is a four-path tightly-coupled computer board; and a junction controller, for controlling 2 paths of CPUs on the computer board;

wherein the four-path tightly-coupled computer board comprises 4 CPUs, the 4 CPUs are interconnected internally, and share memories with each other; and all CPUs in the N single junction prototype verification systems are interconnected through the junction controller chipsets and the crossbar-switch interconnection router chipsets, and share memories with each other.

10. The system according to claim 9, wherein, a value of N is 8; and a value of M is 4.

11. An implementation method for a high-end fault-tolerant computer system according to claim 9, comprising:

selecting a computer board, wherein, the computer board is a four-path tightly-coupled computer board;

selecting a junction controller, for controlling 2 paths of CPUs on the computer board to form a single junction interconnection;

interconnecting the plurality of the single junctions by using the interconnection router chipsets, wherein there are N single junctions and M crossbar-switch interconnection router chipsets (NR), each crossbar-switch interconnection router chipset is used to achieve internal interconnection among the N single junctions, switching is not performed among all crossbar-switch interconnection router chipsets, and both M and N are positive integers greater than or equal to 2;

wherein the four-path tightly-coupled computer board comprises 4 CPUs, the 4 CPUs are interconnected internally, and share memories with each other; and all CPUs in the N single junction prototype verification systems are interconnected through the junction controller chipsets and the crossbar-switch interconnection router chipsets, and share memories with each other.

12. The method according to claim 11, wherein, a value of N is 8; and a value of M is 4.

\* \* \* \* \*

UNITED STATES PATENT AND TRADEMARK OFFICE
CERTIFICATE OF CORRECTION

PATENT NO. : 8,769,459 B2  Page 1 of 1
APPLICATION NO. : 14/002827
DATED : July 1, 2014
INVENTOR(S) : Endong Wang, Leijun Hu and Rengang Li It is certified that error appears in the above-identified patent and that said Letters Patent is hereby corrected as shown below:

Title Page, Item (75) Inventors:

"Edong Wang" should be --Endong Wang--

Signed and Sealed this
Fourth Day of November, 2014

Michelle K. Lee
*Deputy Director of the United States Patent and Trademark Office*